US012317508B2

(12) United States Patent
Samant et al.

(10) Patent No.: US 12,317,508 B2
(45) Date of Patent: May 27, 2025

(54) TUNING PERPENDICULAR MAGNETIC ANISOTROPY OF HEUSLER COMPOUND IN MRAM DEVICES

(71) Applicants: INTERNATIONAL BUSINESS MACHINES CORPORATION, Armonk, NY (US); Samsung Electronics Co., Ltd., Gyeonggi-Do (KR)

(72) Inventors: Mahesh Samant, San Jose, CA (US); Panagiotis Charilaos Filippou, Fremont, CA (US); Yari Ferrante, San Jose, CA (US); Chirag Garg, San Jose, CA (US); Jaewoo Jeong, San Jose, CA (US); . Ikhtiar, San Jose, CA (US)

(73) Assignees: International Business Machines Corporation, Armonk, NY (US); SAMSUNG ELECTRONICS CO., LTD, Gyeonggi-Do (KR)

( * ) Notice: Subject to any disclaimer, the term of this patent is extended or adjusted under 35 U.S.C. 154(b) by 897 days.

(21) Appl. No.: 17/450,691

(22) Filed: Oct. 13, 2021

(65) Prior Publication Data

US 2023/0116592 A1    Apr. 13, 2023

(51) Int. Cl.
*H10B 61/00*    (2023.01)
*H10N 50/80*    (2023.01)
*H10N 50/85*    (2023.01)

(52) U.S. Cl.
CPC ............. *H10B 61/00* (2023.02); *H10N 50/80* (2023.02); *H10N 50/85* (2023.02)

(58) Field of Classification Search
CPC ........ H10B 61/00; H10N 50/80; H10N 50/85; H10N 50/10; G11C 11/161; H01F 10/1936; H01F 10/3254; H01F 10/3272; H01F 10/3286; H01F 41/307
See application file for complete search history.

(56) References Cited

U.S. PATENT DOCUMENTS

| | | |
|---|---|---|
| 6,834,005 B1 | 12/2004 | Parkin |
| 9,406,365 B1 | 8/2016 | Jeong |
| 10,170,696 B1 | 1/2019 | Jeong |
| 10,177,305 B2 | 1/2019 | Jeong |
| 10,396,123 B2 | 8/2019 | Jeong |

(Continued)

OTHER PUBLICATIONS

T. Nakatani et al., "Advanced CPP-GMR Spin-Valve Sensors for Narrow Reader Applications," in IEEE Transactions on Magnetics, vol. 54, No. 2, pp. 1-11, Feb. 2018, Art No. 3300211, doi: 10.1109/TMAG.2017.2753221. (Year: 2018).*

*Primary Examiner* — Jerome Leboeuf
(74) *Attorney, Agent, or Firm* — Jeffrey M. Ingalls

(57) ABSTRACT

A device is provided. The device includes a multi-layered structure that is non-magnetic at room temperature, the multi-layered structure comprising alternating layers of Co and E, wherein E comprises at least one other element selected from the group consisting of Ge, Ga, Sn and Al, wherein a composition of the multi-layered structure is represented by $Co_{1-x}E_x$, with x being in a range from 0.42 to 0.55. The device also includes a combined layer provided in contact with the multi-layered structure, the combined layer including an insertion layer comprising Co or Fe or Mn or Al in contact with a Heusler compound.

21 Claims, 15 Drawing Sheets

(56) References Cited

U.S. PATENT DOCUMENTS

| | | |
|---|---|---|
| 10,453,598 B2 | 10/2019 | Kazuumi |
| 10,651,234 B2 | 5/2020 | Jeong |
| 2015/0294707 A1* | 10/2015 | Apalkov ................ H10N 50/10 |
| | | 365/158 |
| 2020/0044144 A1* | 2/2020 | Sukegawa ............. G11C 11/161 |
| 2020/0105999 A1 | 4/2020 | Jeong |
| 2020/0243755 A1 | 7/2020 | Jeong |
| 2020/0259076 A1* | 8/2020 | Filippou ................ H10N 50/10 |
| 2020/0388302 A1* | 12/2020 | Inubushi .................. H03H 2/00 |
| 2022/0130901 A1* | 4/2022 | Sonobe .................. H10B 61/00 |
| 2022/0223783 A1* | 7/2022 | Jeong .................... G11C 11/161 |

* cited by examiner

US 12,317,508 B2

TUNING PERPENDICULAR MAGNETIC ANISOTROPY OF HEUSLER COMPOUND IN MRAM DEVICES

BACKGROUND

The present disclosure relates generally to semiconductor devices, and in particular, to magnetic random access memory (MRAM) devices that rely on spin transfer torque, racetrack memory and hard disk storage.

In certain magnetic random access memory (MRAM) devices, the basic storage element is a magnetic tunnel junction (MTJ), which may include two magnetic layers separated by an ultra-thin insulating layer referred to as a "tunnel barrier." The resistance of the MTJ device depends on the relative orientation of the magnetization of the two magnetic layers. The magnetization of the so-called storage or memory layer is toggled between being parallel or anti-parallel to the magnetization of the reference magnetic layer. Currently, the change in magnetic state of the MTJ device is achieved via the spin transfer torque (STT) effect by passing an electric current through the device. In certain MRAM devices, the magnetic electrodes of the MTJ may be formed from ferromagnetic alloys of Co, Fe, and B with their magnetic moment aligned perpendicular to the layer. This perpendicular alignment of magnetization of a CoFeB alloy arises from interfacial effects which are typically weak, thus limiting the MRAM devices to sizes≥20 nm. It may be desirable to find alternative magnetic materials for use within MTJs which have perpendicular magnetic anisotropy (PMA) due to their bulk properties.

Heusler compounds can be a promising candidate material which could enable scaling of MRAM devices below 20 nm. Heusler compounds have a chemical formula of $X_2YZ$, where X and Y atoms are transition metals or lanthanides and the Z atom is a main group element. Binary (X=Y) and ternary Heusler alloys consist of two or three different types of atoms, respectively. Heusler compounds take up two different structures depending on the location of X and Y atoms in the unit cell. In a 'regular' Heusler compound the X atoms occupy two sites tetrahedrally coordinated (T) by the Z atom, and the Y atom is octahedrally-coordinated (O) by Z atoms. In an 'inverse' Heusler structure one of the X atoms is interchanged with Y atoms so that there is one X atom in a T site and one in a O site. When X and Y atoms are magnetic 3d transition metals the Heusler compounds can display magnetic ground states which can either be ferro-magnetic (FM) or ferri-magnetic (FiM). The magnetic moment per unit cell can be tuned by varying X and Y atoms and can even be tuned to zero for the so-called fully compensated Heusler compounds. Some Heusler compounds have a tetragonal structure such that thin films may exhibit perpendicular magnetic anisotropy along their tetragonal axis at room temperature (RT). Magnetic materials showing intrinsic PMA and low magnetic moment may be important for deeply scaled spin transfer torque magnetic random access memory (STT-MRAM) applications. The use of these Heusler compounds in perpendicular MTJ (p-MTJ) nano-devices could allow for increased memory storage and reduced switching current densities, while preserving sufficient stability against thermal perturbations.

One exemplary magnetic material among the family of tetragonal Heuslers is the FiM $Mn_3Ge$ compound whose crystal structure consists of alternating Mn—Mn and Mn—Ge layers having opposite magnetization. Other examples of such tetragonal Heusler compounds are binary compounds (e.g., $Mn_3Z$, where Z=Ga, Sn, or Sb) and ternary compounds (e.g., $Mn_2CuSb$, $Mn_2CoSn$, $Mn_2OsSn$, etc.). The structural and magnetic properties of the $Mn_3Ge$ films depend sensitively on its composition and atomic order which are influenced by the adjacent layers, growth temperature, and annealing after deposition. Thin films of these tetragonal Heusler alloys with perpendicular magnetic anisotropy (PMA) can be grown on underlayers such as $TaN/IrMn_3$ and $TaN/IrMn_3/TaN$. These underlayers were selected as they promote growth of $Mn_3Ge$ compound with its tetragonal axis along the layer normal and more importantly they closely match the in-plane a-axis lattice constant of the $Mn_3Ge$ compound (a($Mn_3Ge$)=3.73 Å (theoretical prediction) and a($TaN/IrMn_3$ or $TaN/IrMn_3/TaN$)=~3.76 Å). The coercive field, Hc, of $Mn_3Ge$ layers on $TaN/IrMn_3$ and $TaN/IrMn_3/TaN$ underlayers is large (several tens of kOe) and depends on the thickness of the $Mn_3Ge$ layer. Furthermore, the anisotropy field, $H_k$, of thick $Mn_3Ge$ is larger than 70 kOe (accessible magnetic field in a Quantum Design SQUID magnetometer). The minimum thickness of Heusler layer with perpendicular magnetic anisotropy (PMA) on these underlayers is ~50 Å. Such Heusler layers are too thick to facilitate Spin transfer torque (STT) switching of their magnetization in MTJ devices with a Heusler storage layer.

Another set of underlayers such as CoGa or CoAl templating layers may allow atomic ordering of Heusler compounds at layer thicknesses as small as a single unit cell (~8 Å). More importantly, these underlayers also promote the growth of the Heusler compound with strong perpendicular magnetic anisotropy. The coercivity $H_c$ depends strongly on the Heusler compound and on the thickness of the Heusler layer, and can exceed several kOe for thicknesses of even 11-13 Å. The STT switching of such ultrathin Heusler layers has been demonstrated (U.S. Pat. No. 10,651,234). At larger $Mn_3Ge$ layer thickness the $H_c$ and $H_k$ of the $Mn_3Ge$ layer are too high to allow for STT switching of MTJ devices with $Mn_3Ge$ as storage layer. This is a significant limitation as for a Heusler compound such as $Mn_3Ge$ as thicknesses of 11-13 Å are less than the thickness for 2 unit cells and thus any small variations of layer thickness or morphology can strongly affect switching characteristic of Heusler based MTJ device.

Therefore, it may be desirable to develop MTJ devices and methods of manufacturing MTJ devices which can significantly lower the $H_c$ and the $H_k$ of Heusler compound such that even MTJ devices with Heusler storage layer with thickness >20 Å can be switched by STT means.

SUMMARY

Embodiments of the present disclosure relate to a device. The device includes a multi-layered structure that is non-magnetic at room temperature, the multi-layered structure comprising alternating layers of Co and E, wherein E comprises at least one other element selected from the group consisting of Ge, Ga, Sn and Al, wherein a composition of the multi-layered structure is represented by $Co_{1-x}E_x$, with x being in a range from 0.42 to 0.55. The device also includes a combined layer provided in contact with the multi-layered structure, the combined layer including an insertion layer comprising Co or Fe or Mn or Al in contact with a Heusler compound. The device may enable lowering the Hc and the Hk of Heusler compound such that even magnetic tunnel junction (MTJ) devices with Heusler storage layer with thickness >20 Å can be switched by spin transfer torque (STT) means.

In certain embodiments, the combined layer is a first magnetic layer that forms part of a magnetic tunnel junction.

In certain embodiments, the magnetic moment of the first magnetic layer is substantially perpendicular to an interface between the multi-layered structure and the first magnetic layer. In certain embodiments, the first magnetic layer has a thickness of less than 5 nm. In certain embodiments, the insertion layer has a thickness of less than or equal to 3 Å. In certain embodiments, the Heusler compound is a binary Heusler. In certain embodiments, the Heusler compound includes one or more of $Mn_{3.3-x}Ge$, $Mn_{3.3-x}Sn$, and $Mn_{3.3-y}Sb$, where x is at least 0 and not more than 0.8 for $Mn_{3.3-x}Ge$ and $Mn_{3.3-x}Sn$ and where y is at least 0 and not more than 1.3 in the case of $Mn_{3.3-y}Sb$. In certain embodiments, the Co within the multi-layered structure is replaced by a CoIr alloy and/or E includes an alloy selected from the group consisting of Al Sn, AlGa, AlGe, AlGaGe, AlGaSn, AlGeSn, and AlGaGeSn. In certain embodiments, the device further includes a substrate underlying the multi-layered structure. In certain embodiments, a $Mn_xN$ or $V_yN$ layer is interposed between the substrate and the multi-layered structure. In certain embodiments, the device further includes a tunnel barrier layer overlying the first magnetic layer, thereby permitting current to pass through both the tunnel barrier layer and the first magnetic layer. In certain embodiments, the device further includes a second magnetic layer provided in contact with the tunnel barrier layer. In certain embodiments, the tunnel barrier layer comprises MgO. In certain embodiments, the tunnel barrier layer comprises $Mg_{1-z}Al_{2+(2/3)z}O_4$, wherein $-0.5<z<0.5$. According to the various embodiments, the device may enable lowering the $H_c$ and the $H_k$ of Heusler compound such that even magnetic tunnel junction (MTJ) devices with Heusler storage layer with thickness >20 Å can be switched by spin transfer torque (STT) means.

Embodiments of the present disclosure relate to a method of using a device as a memory element. The device includes a multi-layered structure that is non-magnetic at room temperature, the multi-layered structure comprising alternating layers of Co and E, wherein E comprises at least one other element selected from the group consisting of Ge, Ga, Sn and Al, wherein a composition of the multi-layered structure is represented by $Co_{1-x}E_x$, with x being in a range from 0.42 to 0.55. The device also includes a combined layer provided in contact with the multi-layered structure, the combined layer including an insertion layer comprising Co or Fe or Mn or Al in contact with a Heusler compound. In certain embodiments, the memory element is a racetrack memory device. According to the various embodiments, the device may enable lowering the $H_c$ and the $H_k$ of Heusler compound such that even magnetic tunnel junction (MTJ) devices with Heusler storage layer with thickness >20 Å can be switched by spin transfer torque (STT) means.

Embodiments of the present disclosure relate to a magnetic tunnel junction device. The magnetic tunnel junction (MTJ) device includes a substrate. The MTJ device also includes a multi-layered structure that is non-magnetic at room temperature, the multi-layered structure comprising alternating layers of Co and E, wherein E comprises at least one other element selected from the group consisting of Ge, Ga, Sn and Al, wherein a composition of the multi-layered structure is represented by $Co_{1-x}E_x$, with x being in a range from 0.42 to 0.55; and a first magnetic layer provided in contact with the multi-layered structure, the first magnetic layer including an insertion layer comprising Co or Fe or Mn or Al in contact with a Heusler compound; a tunnel barrier layer provided on the first magnetic layer; and a second magnetic layer provided on the tunnel barrier layer. According to the various embodiments, the device may enable lowering the $H_c$ and the $H_k$ of Heusler compound such that even magnetic tunnel junction (MTJ) devices with Heusler storage layer with thickness >20 Å can be switched by spin transfer torque (STT) means.

In certain embodiments, the MTJ device further includes a synthetic anti-ferromagnetic layer provided on the second magnetic layer. In certain embodiments the first magnetic layer has a magnetic moment that is switchable, and the second magnetic layer has a magnetic moment that is fixed. In certain embodiments the first magnetic layer has a magnetic moment that is fixed, and the second magnetic layer has a magnetic moment that is switchable. According to the various embodiments, the device may enable lowering the $H_c$ and the $H_k$ of Heusler compound such that even magnetic tunnel junction (MTJ) devices with Heusler storage layer with thickness >20 Å can be switched by spin transfer torque (STT) means.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, explain the principles of the disclosure. The drawings are only illustrative of certain embodiments and do not limit the disclosure.

DETAILED DESCRIPTION

Figure 1:
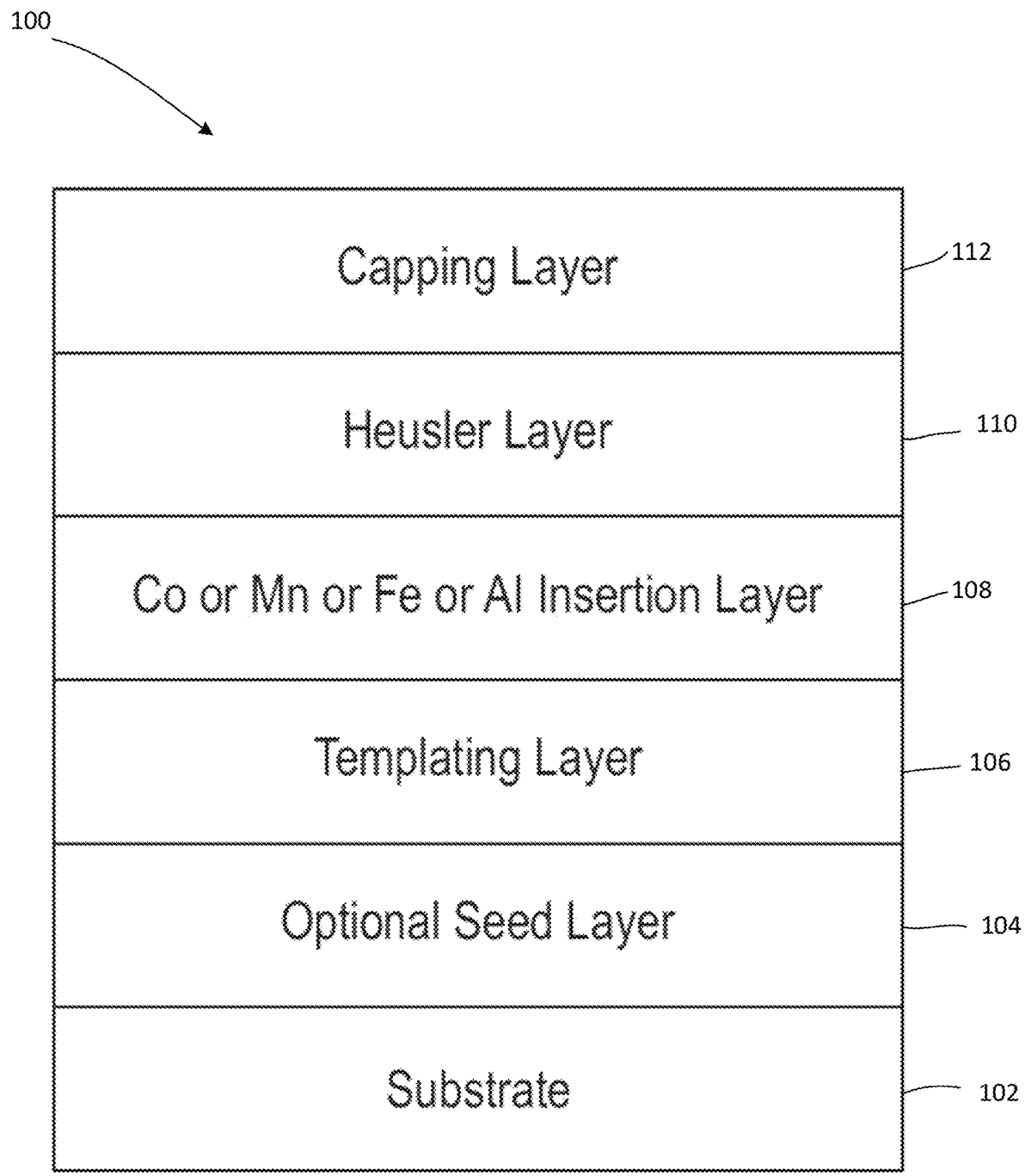
FIG. 1 is a cross-sectional side view of a material stack that incorporates a thin insertion layer of Co or Mn or Fe or Al at the templating layer/Heusler ($CoAl/Mn_3Ge$) interface, according to embodiments.

The present embodiments relate to MTJ devices and methods of manufacturing MTJ devices which enable achieving a desired perpendicular magnetic anisotropy field ($H_k$) for the Heusler layer by insertion of ultrathin (of the order of 2 Å) layers of Co or Mn or Fe or Al in contact or within the Heusler compound ($Mn_3Ge$).

Embodiments of the present disclosure relate to magnetic junctions usable in magnetic devices, such as magnetic memories, and the devices using such magnetic junctions. The magnetic memories may include spin transfer torque magnetic random access memories (STT-MRAMs), spin-orbit coupling torque (SOT) memories, and may be used in electronic devices employing nonvolatile memory. Other devices including magnetic junctions, particularly STT or SOT programmable magnetic junctions include but are not limited to logic, neuromorphic computing cells and other devices. Electronic devices include but are not limited to cellular phones, smart phones, tables, laptops and other portable and non-portable computing devices.

Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment," "one embodiment" and "another embodiment" may refer to the same or different embodiments as well as to multiple embodiments. The embodiments will be described with respect to systems and/or devices having certain components. However, the systems and/or devices may include more or fewer components than those shown, and variations in the arrangement and type of the components may be made without departing from the scope of the present embodiments. The exemplary embodiments will also be described in the context of particular methods having certain steps. However, the method and system operate effectively for other methods having different and/or additional steps and steps in different orders that are not inconsistent with the exemplary embodiments. Thus, the present disclosure is not intended to be limited to the embodiments shown, but is to be accorded the widest scope consistent with the principles and features described herein.

Unless defined otherwise, all technical and scientific terms used herein have the same meaning as commonly understood by one of ordinary skill in the art to which the present embodiment relate. It is noted that the use of any and all examples, or exemplary terms provided herein is intended merely to better illuminate the embodiments and is not a limitation on the scope of the embodiments unless otherwise specified. Further, unless defined otherwise, all terms defined in generally used dictionaries may not be overly interpreted.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the structures that make up an integrated circuit device, lithography and etch pattern transfer steps are repeated multiple times. Each pattern being printed on the wafer is aligned to the previously formed patterns and slowly the conductors, insulators and selectively doped regions are built up to form the final device.

Referring now to the drawings in which like numerals represent the same or similar elements and initially to FIG. 1, this figure shows a cross-sectional side view of a material stack 100 that incorporates a thin insertion layer of Co or Mn or Fe or Al at the CoAl/Mn$_3$Ge interface (i.e., between the templating layer 106 and the Heusler layer 110), according to embodiments. As shown in FIG. 1, a substrate 102 is provided. The semiconductor substrate 102 includes semiconductor material including, but not limited to, silicon (Si), silicon germanium (SiGe), silicon carbide (SiC), Si:C (carbon doped silicon), silicon germanium carbide (SiGeC), carbon doped silicon germanium (SiGe:C), II-V compound semiconductor or other like semiconductor. In addition, multiple layers of the semiconductor materials can be used as the semiconductor material of the substrate. The semiconductor substrate 102 can be a bulk substrate or a semiconductor-on-insulator substrate such as, but not limited to, a silicon-on-insulator (SOI), silicon-germanium-on-insulator (SGOI) or III-V-on-insulator substrate including a buried insulating layer, such as, for example, a buried oxide or nitride layer. In certain examples, the substrate 102 is a MgO substrate.

In the embodiments described herein, the material stacks 100 of FIG. 1 (or 200 of FIG. 2, or 300 of FIG. 3, or MTJ device 900 of FIG. 9 or MTJ device 950 of FIG. 10) may be deposited in an ultra-high vacuum magnetron sputtering chamber with, for example, a base pressure of ~$2 \times 10^{-9}$ Torr or better on MgO substrates or other appropriate substrates 102 such as Si substrates. The MgO(001) single crystal substrates may be cleaned in methanol with sonication for 30 minutes, and then dried in a hot nitrogen furnace at ~ 60° C. In addition, the substrates 102 may be annealed inside the deposition chamber at ~385° C. for 30 min prior to deposition of material stacks.

As shown in FIG. 1, an optional seed layer 104 may be provided on the substrate 102. The seed layer 104 may comprise Cr or any other suitable material. A templating layer 106 may be a CoAl layer and may be formed on the seed layer 104. The templating layer 106 may be a multi-layered structure that is non-magnetic at room temperature, and which comprises alternating layers of Co or CoIr alloy and at least one other element E (preferably Al or Ga; or Al alloyed with Ga, Ge, Sn or any combination thereof, such as AlSn, AlGe, AlGaGe, AlGaSn, AlGeSn, and AlGaGeSn). Note that CoIr refers to an alloy of Co and Ir without referring to specific stoichiometry. The composition of this structure is represented by $Co_{1-x}E_x$ or $(CoIr)_{1-x}E_x$ with x being in the range from 0.45 to 0.55. Alternately, the templating layer 106 may be IrAl or RuAl or a bilayer of CoAl/IrAl or CoAl/RuAl. The composition of these alternate layers of the templating layer 106 can also be represented as indicated above for the CoAl layer.

As shown in FIG. 1, and insertion layer 108 is formed on the templating layer 106, a Heusler layer 110 is formed on the insertion layer 108, and a capping layer 112 is formed on the Heusler layer 110. The insertion layer 108 may comprise Co, Mn, Fe or Al.

Certain layers of the material stack 100 of FIG. 1 may be deposited using direct current (DC) or radio frequency (RF) magnetron sputtering, reactive magnetron sputtering or ion beam deposition, for example. In one example, the optional seed layer 104 may include a MgO buffer layer (not shown) that may be deposited by RF magnetron sputtering from an MgO target. In certain examples, MgO may also be used as a tunnel barrier (not shown) in the MTJ device, and the same method of RF magnetron sputtering may be used to form this layer. In certain examples, the templating layer 106 (e.g., of CoAl) and the Heusler layer 110 (e.g., of Mn$_3$Ge) may be deposited by direct current (DC) magnetron sputtering with Ar gas at a sputter gas at a pressure of ~3 mTorr.

The Heusler compound of the Heusler layer 110 may include one or more of $Mn_{3.3-x}Ge$, $Mn_{3.3-x}Sn$, and $Mn_{3.3-y}Sb$, where x is at least 0 and not more than 0.8 for $Mn_{3.3-x}Ge$ and $Mn_{3.3-x}Sn$ and where y is at least 0 and not more than 1.3 in the case of $Mn_{3.3-y}Sb$. Note that CoFeB refers to an alloy of Co, Fe, and B without referring to specific stoichiometry. In examples where a CoFeB layer (not shown) is part of 100, it may be chosen such that its magnetic moment is aligned along a direction that is perpendicular to the layer thickness. Moreover, in 100, typically a Synthetic Anti-Ferromagnet (SAF) layer (not shown) of a Co/Pt multilayer (not shown) is magnetically coupled to the underlying CoFeB layer (not shown) to achieve needed performance. A thin layer (not shown) of Ta or Ir or Ru (order of few A) may typically be interposed between the CoFeB and the SAF layer. A variety of cap layers (not shown) may also be used to prevent oxidation of the layers underneath during the exposure of the entire material stack to ambient environment.

Figure 2:
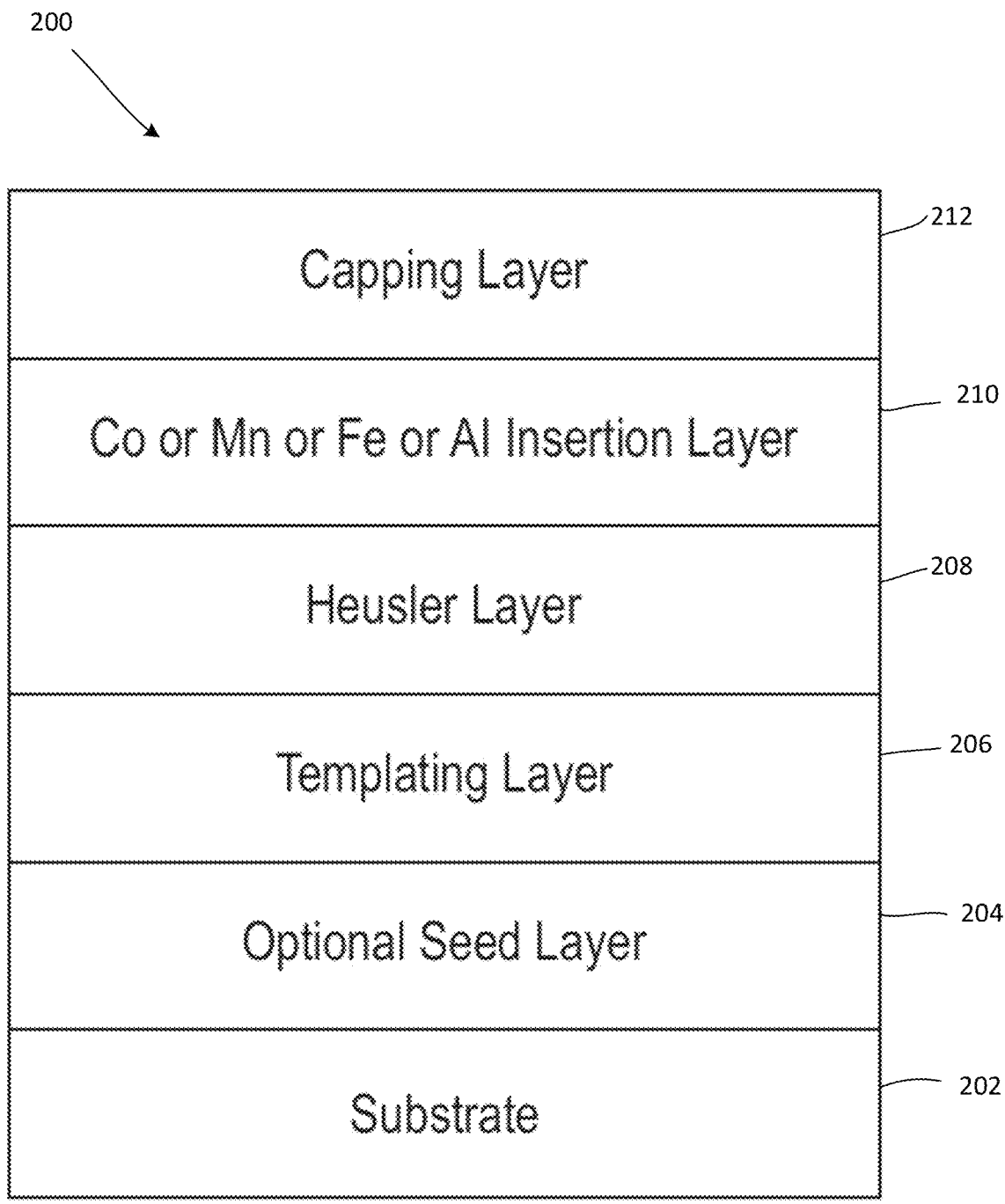
FIG. 2 is a cross-sectional side view of a material stack that incorporates a thin insertion layer of Co or Mn or Fe or Al on top of the Heusler ($Mn_3Ge$) layer, according to embodiments.

Referring now to FIG. 2, this figure is a cross-sectional side view of a material stack 200 that incorporates a thin insertion layer 210 of Co or Mn or Fe or Al at the capping layer/$Mn_3Ge$ interface (i.e., between the Heusler layer 208 and the capping layer 212), according to embodiments. As shown in FIG. 2, material stack 200 includes a substrate 202, an optional seed layer 204, a templating layer 206, a Heusler layer 208, an insertion layer 210, and a capping layer 212. Thus, in contrast to the embodiment described above with respect to FIG. 1, the insertion layer 210 is located above the Heusler layer 208 rather than below it.

Figure 3:
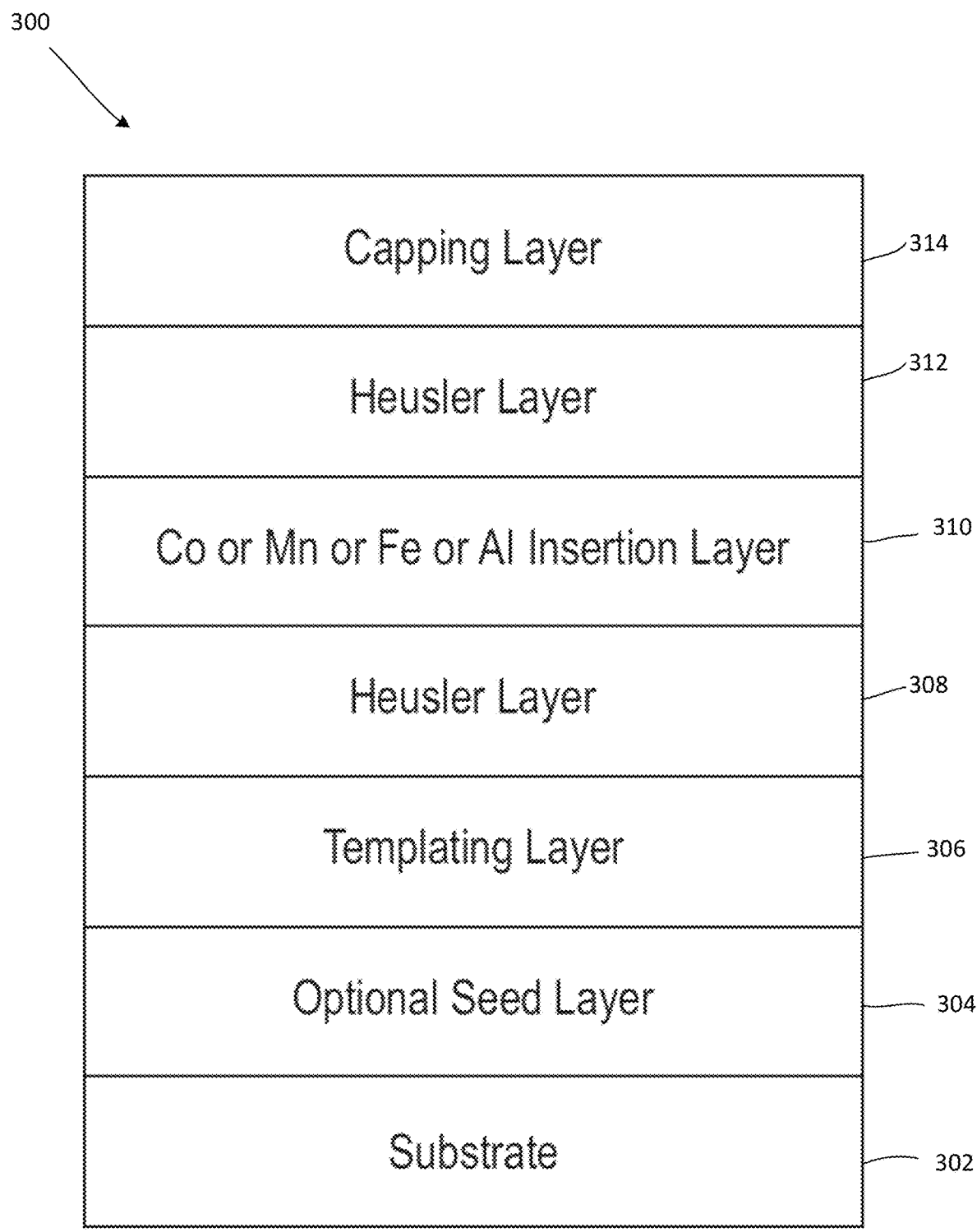
FIG. 3 is a cross-sectional side view of a material stack that incorporates a thin insertion layer of Co or Mn or Fe or Al within the Heusler ($Mn_3Ge$) layer, according to embodiments.

Referring now to FIG. 3, this figure is a cross-sectional side view of a material stack that incorporates a thin insertion layer 310 of Co or Mn or Fe or Al within the $Mn_3Ge$ layer, according to embodiments (i.e., between the first sub-Heusler layer 308 and the second sub-Heusler layer 312), according to embodiments. As shown in FIG. 3, material stack 300 includes a substrate 302, an optional seed layer 304, a templating layer 306, a first sub-Heusler layer 308, an insertion layer 310, a second sub-Heusler layer 312, and a capping layer 314. Thus, in contrast to the embodiments described above with respect to FIGS. 1 and 2, the insertion layer 310 is located in the middle of the Heusler layer (i.e., between the first sub-Heusler layer 308 and the second sub-Heusler layer 312) rather than below it or above it.

The effect of the Co or Mn or Fe or Al insertion layer (i.e., insertion layer 108 of FIG. 1, insertion layer 210 of FIG. 2, or insertion layer 310 of FIG. 3) on the coercivity of the Heusler compound was evaluated by use of the simplified material stack described above with respect to FIG. 1, 2 or 3. In these examples, the material stack has following structures: MgO(001)/20 Å MgO/400 Å Cr/300 Å CoAl/y Å IL/x Å $Mn_3Ge$/Cap layer (FIG. 1); MgO(001)/20 Å MgO/ 400 Å Cr/300 Å CoAl/x Å $Mn_3Ge$/y Å IL/Cap layer (FIG. 2); or MgO(001)/20 Å MgO/400 Å Cr/300 Å CoAl/x1 Å $Mn_3Ge$/y Å IL/x2 Å $Mn_3Ge$/Cap layer (FIG. 3), where y is in the range 0 to 3, x is in the range 8 to 50 Å, x1 and x2 are in the range 0 to 50, and IL signifies the insertion layer of Co or Fe or Mn or Al. Alternatively, the stack may be formed without the optional Cr seed layer and with a smaller CoAl thickness for the templating layers.

Figure 4A:
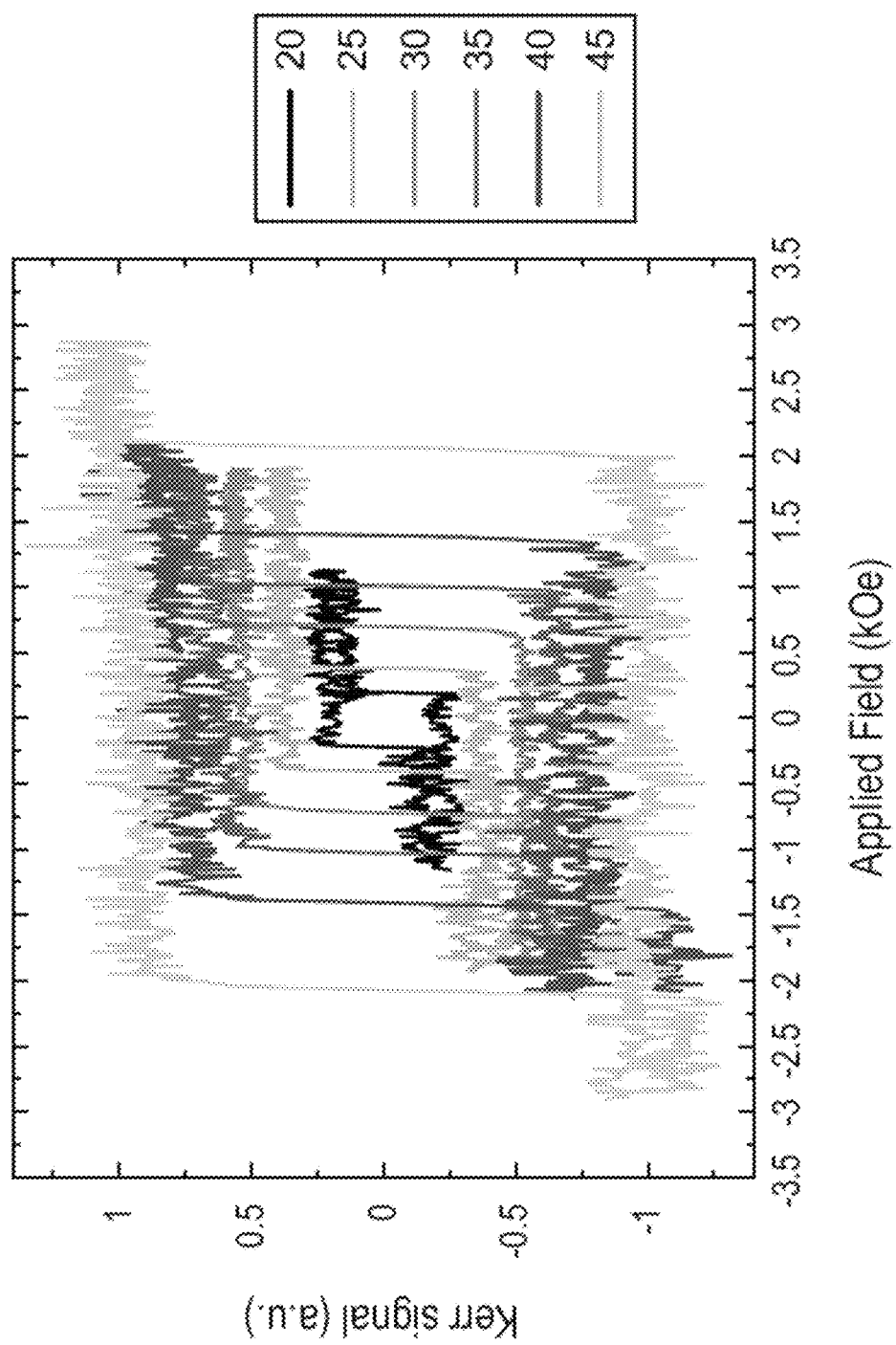
FIG. 4A is a graph that shows the perpendicular magneto-optical Kerr effect (P-MOKE) hysteresis loops for a series of samples with a 2 Å Co insertion layer at the $CoAl/Mn_3Ge$ interface, for different $Mn_3Ge$ thicknesses, according to embodiments.
Figure 4B:
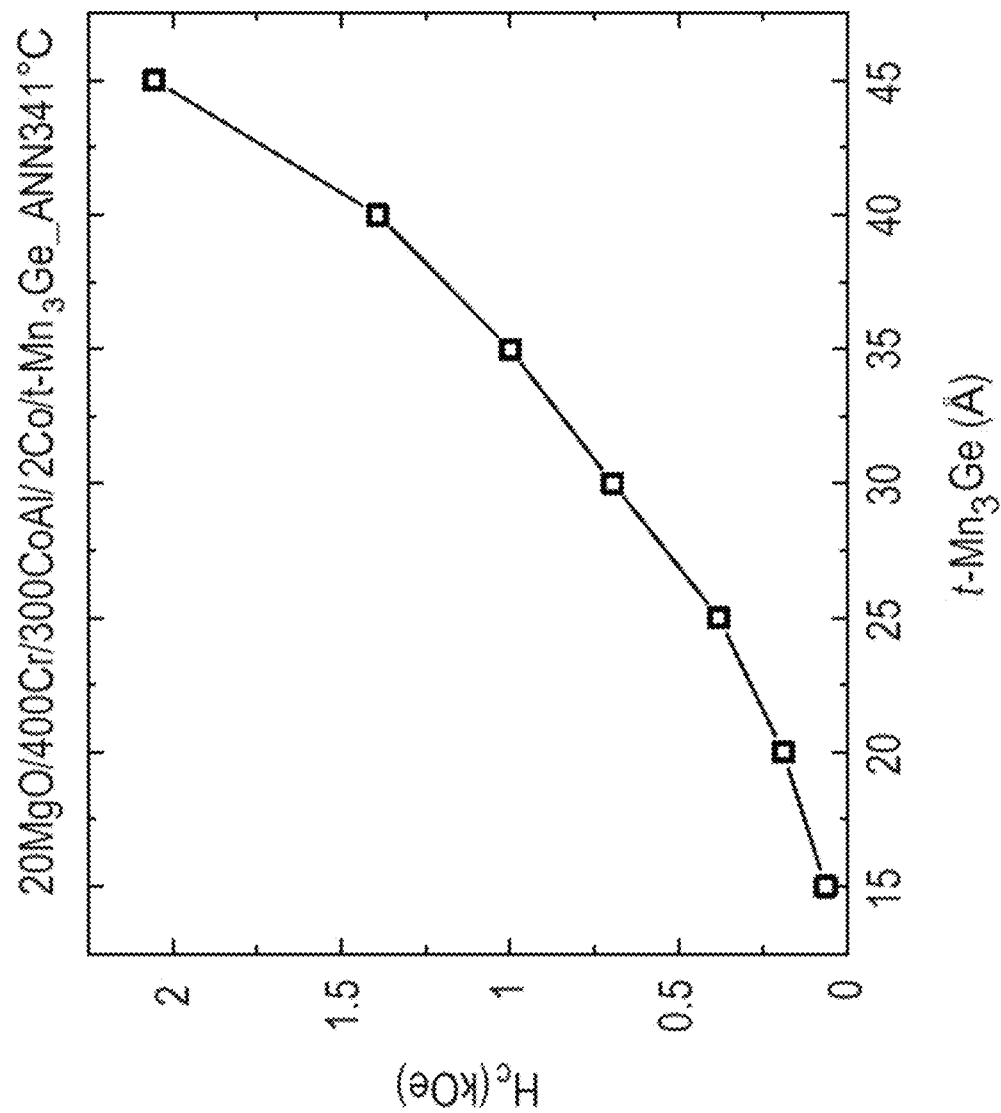
FIG. 4B is a graph that shows a dependence of coercivity ($H_c$) on the thickness of a $Mn_3Ge$ layer with a 2 Å Co insertion layer, according to embodiments.

Referring now to FIGS. 4A and 4B, FIG. 4A is a graph that shows the perpendicular magneto-optical Kerr effect (P-MOKE) hysteresis loops for a series of samples with a 2 Å Co insertion layer at the CoAl/$Mn_3Ge$ interface, for different $Mn_3Ge$ thicknesses, t, and FIG. 4B is a graph that shows a dependence of coercivity ($H_c$) on a thickness of a $Mn_3Ge$ layer with a 2 Å Co insertion layer, according to embodiments. For the examples described in FIGS. 4A and 4B, t varied from 15 to 45, and the capping layer was either 11 Å MgO/5 Å CoFeB/20 Å Ta or 20 Å MgO/20 Å Ta. The $Mn_3Ge$ Heusler layer was in situ annealed at 341° C. prior to deposition of the Capping layer.

FIG. 4A shows the perpendicular magneto-optical Kerr effect (P-MOKE) loops from a series of samples with t=20, 25, 30, 35, 40, and 45 Å having a 2 Å Co insertion layer. Square hysteresis loops indicative of perpendicular magnetic anisotropy (PMA) of the $Mn_3Ge$ layer were observed for all samples. As expected, the intensity of the Kerr signal increases with the thickness of the $Mn_3Ge$ layer. The coercivity ($H_c$) for the 20 Å $Mn_3Ge$ Heusler layer (with the 2 Å Co insertion layer) sample is ~200 Oe (which represents the magnetic field strength), which is significantly lower than $H_c$ of ~5 kOe which may be typically observed for the 20 Å $Mn_3Ge$ layer without such a Co insertion layer. This clearly indicates that the $H_c$ of the $Mn_3Ge$ layer can be significantly lowered by the Co insertion layer. The graph of FIG. 4B shows the dependence of the $H_c$ of the $Mn_3Ge$ layer on its thickness.

Figure 5A:
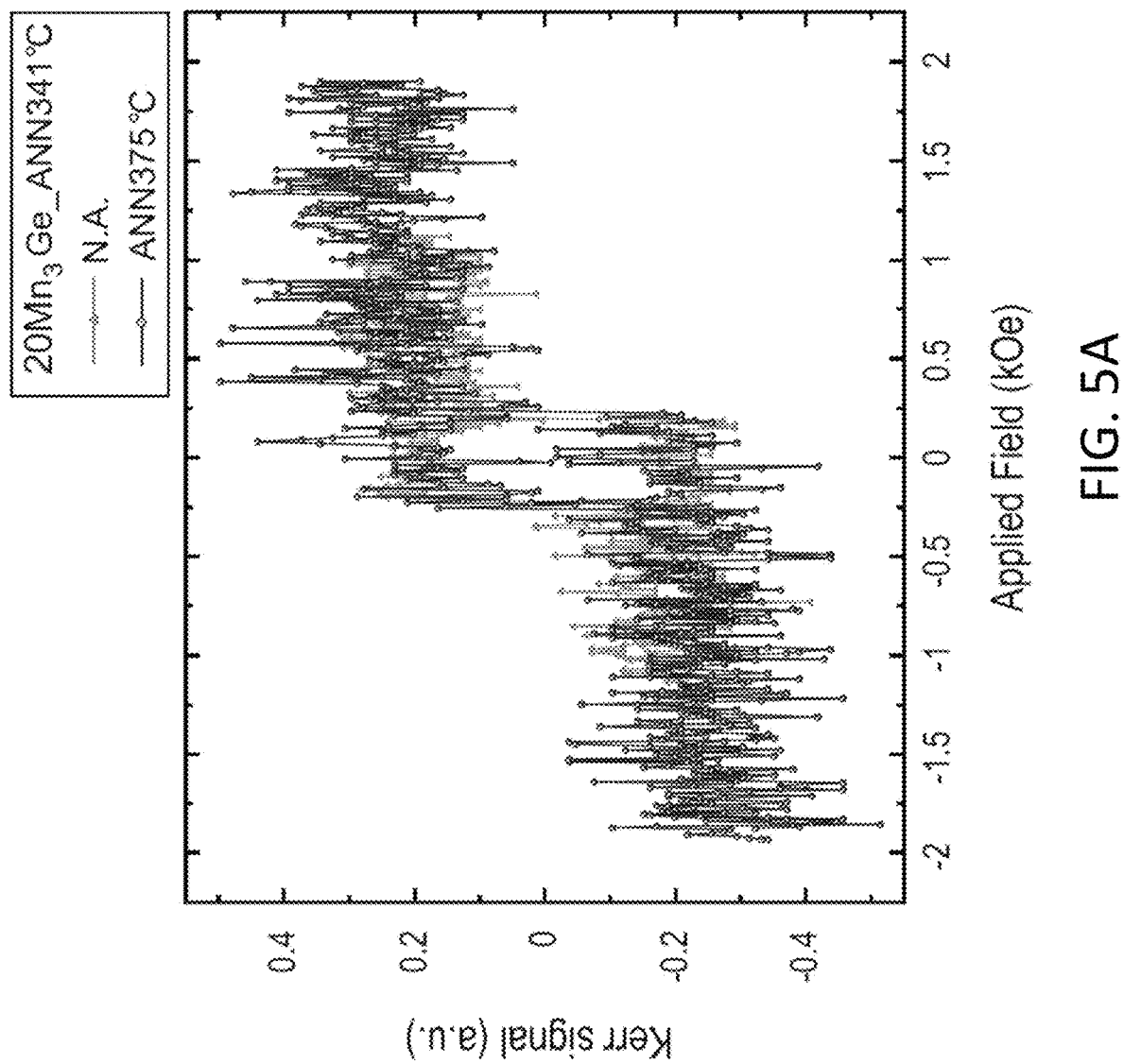
FIG. 5A is a graph that shows the perpendicular magneto-optical Kerr effect (P-MOKE) hysteresis loops for a sample with a 2 Å Co insertion layer and a 20 Å $Mn_3Ge$ layer (as shown in FIG. 4A), annealed in situ at 341° C. after the $Mn_3Ge$ layer, as deposited without additional annealing (N.A.), and annealed ex situ at 375° C., according to embodiments.
Figure 5B:
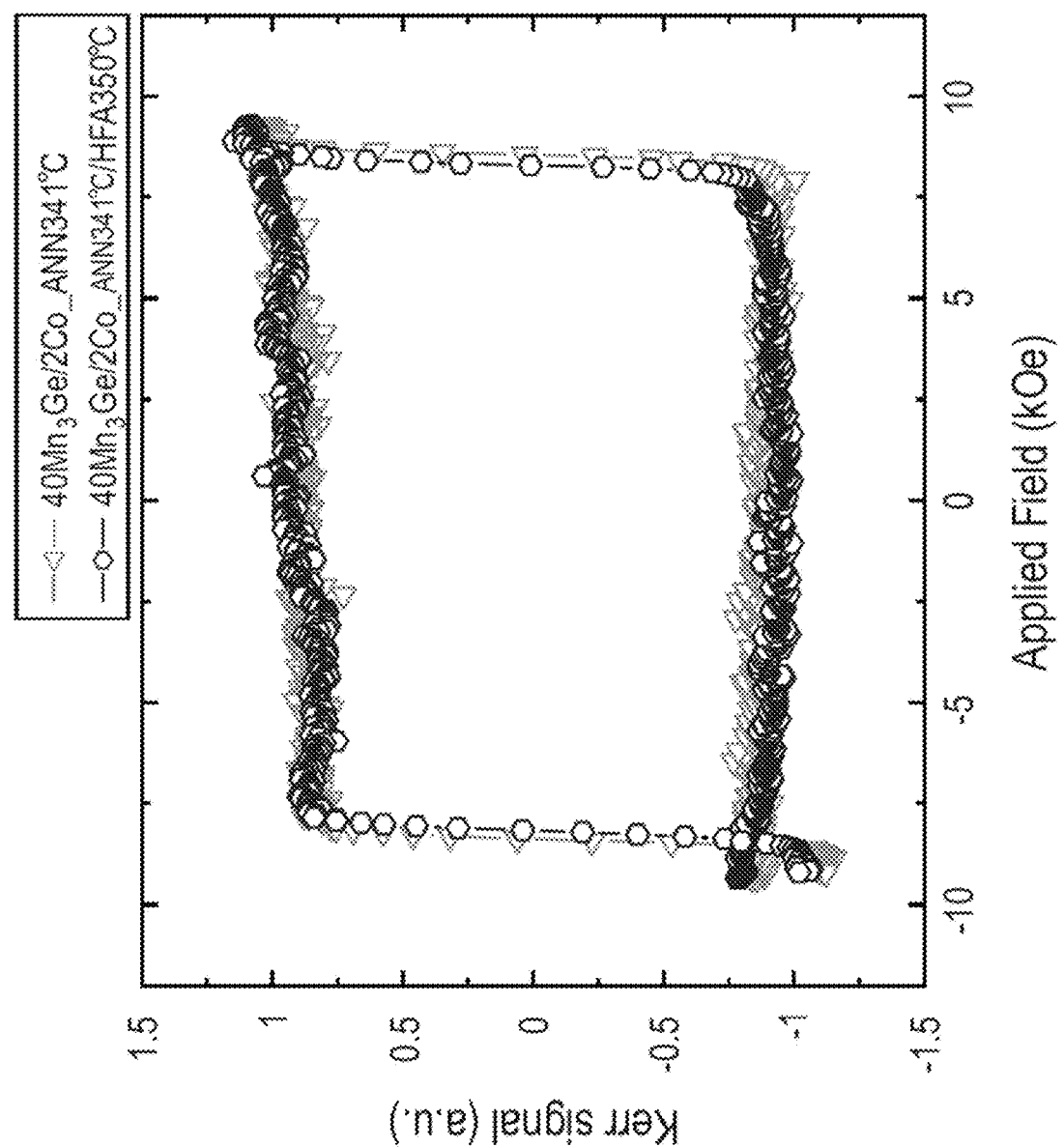
FIG. 5B is a graph that shows the perpendicular magneto-optical Kerr effect (P-MOKE) hysteresis loops for samples with a 2 Å Co insertion layer and a 40 Å $Mn_3Ge$ layer annealed in situ at 341° C. and with an additional ex situ anneal at 350° C., according to embodiments.
Figure 5C:
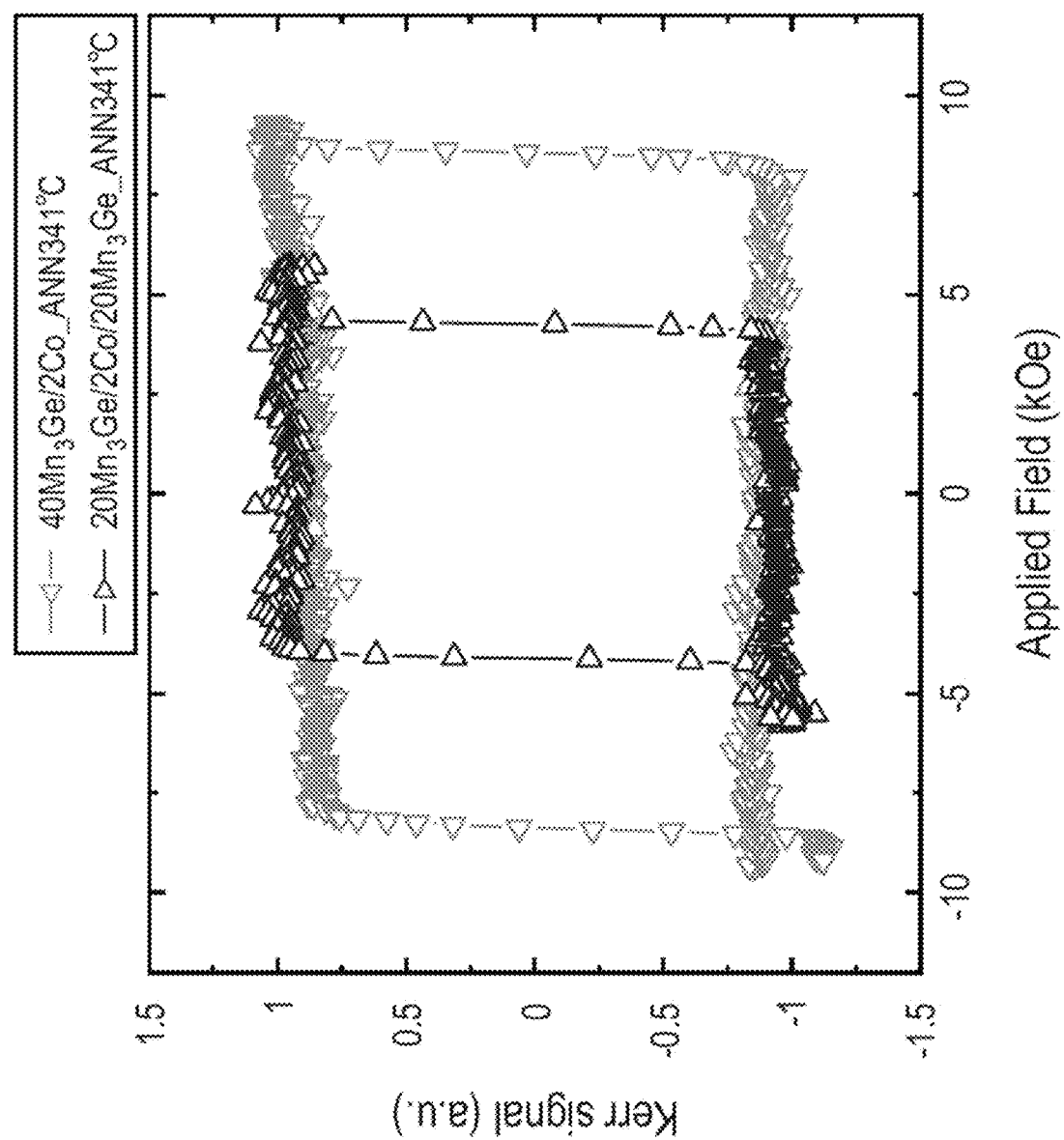
FIG. 5C is a graph that shows the perpendicular magneto-optical Kerr effect (P-MOKE) hysteresis loops for a sample with a 40 Å $Mn_3Ge$ layer and a 2 Å Co insertion layer, and a sample with a 20 Å $Mn_3Ge$ layer, a 2 Å Co insertion layer, and a 20 Å $Mn_3Ge$ layer, where both samples are annealed in situ at 341° C., according to embodiments.

Referring now to FIGS. 5A, 5B and 5C, FIG. 5A is a graph that shows the perpendicular magneto-optical Kerr effect (P-MOKE) hysteresis loops for a sample with a 2 Å Co insertion layer and a 20 Å $Mn_3Ge$ layer (as shown in FIG. 4A), annealed in situ at 341° C. after the $Mn_3Ge$ layer, as deposited without additional annealing, and annealed ex situ at 375° C., FIG. 5B is a graph that shows the perpendicular magneto-optical Kerr effect (P-MOKE) hysteresis loops for samples with a 2 Å Co insertion layer and above a 40 Å $Mn_3Ge$ layer annealed in situ at 341° C. and with an additional ex situ anneal at 350° C., and FIG. 5C is a graph that shows the perpendicular magneto-optical Kerr effect (P-MOKE) hysteresis loops for a sample with a 40 Å $Mn_3Ge$ layer and a 2 Å Co insertion layer above it, and a sample with a 20 Å $Mn_3Ge$ layer, a 2 Å Co insertion layer, and a 20 Å $Mn_3Ge$ layer, where both samples are annealed in situ at 341° C., according to embodiments.

In particular, FIG. 5A compares P-MOKE loops of the sample with 2 Å Co/20 Å $Mn_3Ge$ having undergone varying thermal treatments. The lack of any changes to the P-MOKE loops is indicative of the thermal stability of the material stack. FIG. 5B, which includes P-MOKE loops for stack having 40 Å $Mn_3Ge$/2 Å Co (i.e., the insertion layer is on top of the Heusler layer) with and without ex situ anneal at 350° C., further illustrates that the thermal stability of stack is independent of the location of the insertion layer within the stack. FIG. 5C shows that insertion of 2 Å Co within 40 Å $Mn_3Ge$ layer lowers the $H_c$ of the $Mn_3Ge$ layer more than for the stacks where 2 Å Co layer is placed above the $Mn_3Ge$ layer.

Figure 6A:
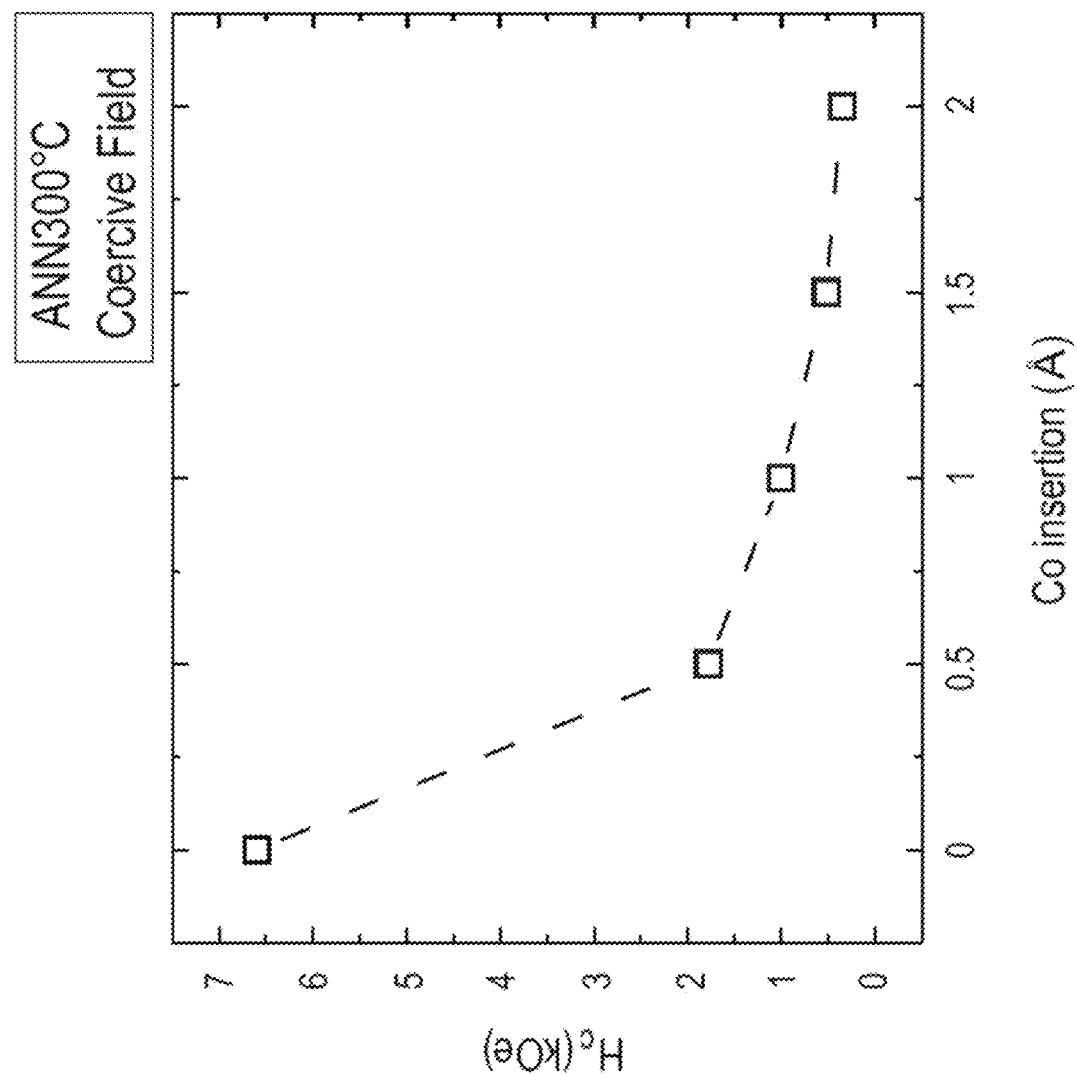
FIG. 6A is a graph that shows the coercivity ($H_c$) of samples with a 15 Å $Mn_3Ge$ Heusler compound as a function of Co insertion layer thickness, where all samples are annealed ex situ (HFA) at 300° C., according to embodiments.
Figure 6B:
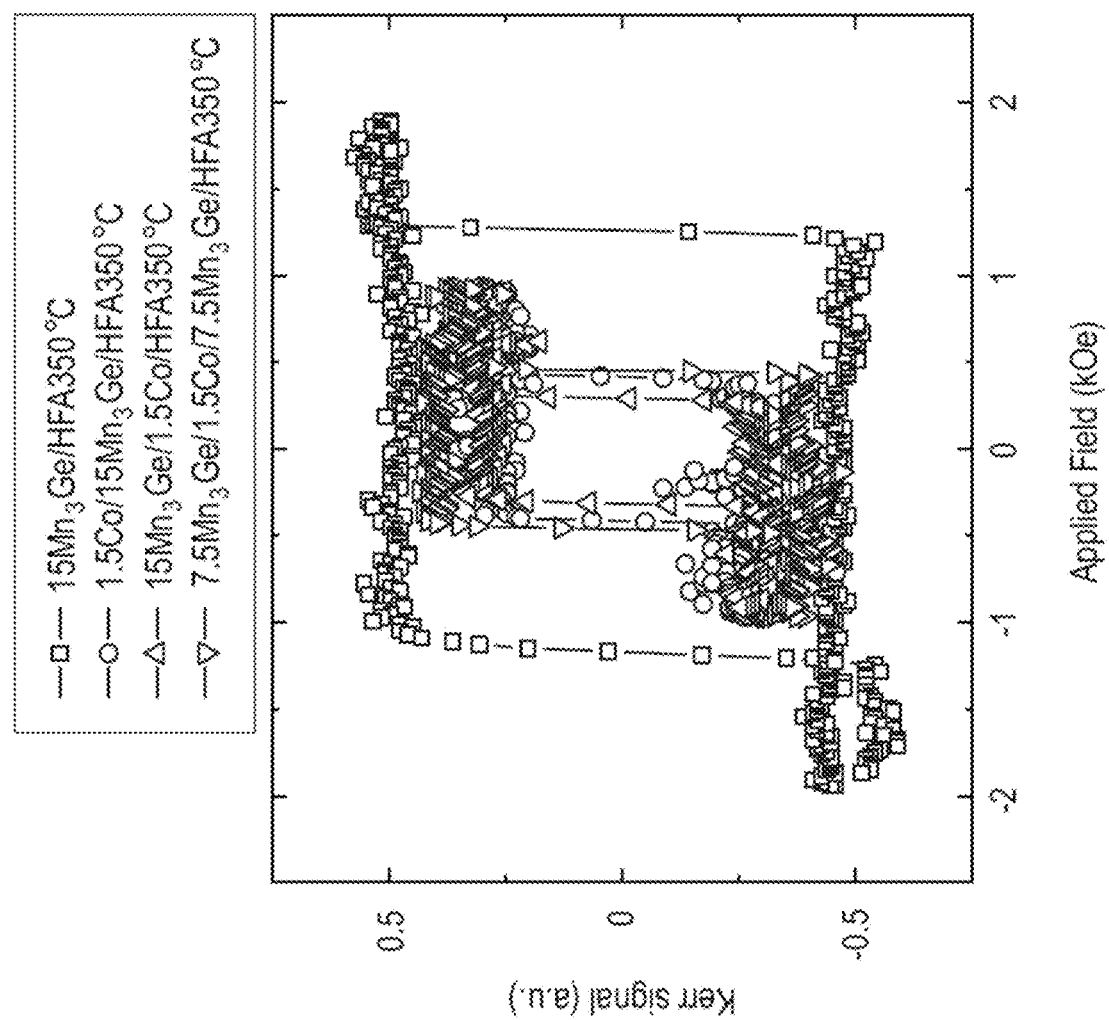
FIG. 6B is a graph that shows the perpendicular magneto-optical Kerr effect (P-MOKE) hysteresis loops for a sample with a 15 Å $Mn_3Ge$ layer, for a sample with 1.5 Å Co/15 Å $Mn_3Ge$ layers, for a sample with 15 Å $Mn_3Ge$/1.5 Å Co layers, and for a sample with 7.5 Å $Mn_3Ge$/1.5 Å Co/7.5 Å $Mn_3Ge$ layers, where all samples are annealed ex situ (HFA) at 350° C., according to embodiments.

Referring now to FIGS. 6A and 6B, FIG. 6A is a graph that shows the coercivity ($H_c$) of samples with a 15 Å $Mn_3Ge$ Heusler compound as a function of Co insertion layer thickness, where all samples are annealed ex situ at 300° C., and FIG. 6B is a graph that shows the perpendicular magneto-optical Kerr effect (P-MOKE) hysteresis loops for a sample with a 15 Å $Mn_3Ge$ layer, for a sample with 1.5 Å Co/15 Å $Mn_3Ge$ layers, for a sample with 15 Å $Mn_3Ge$/1.5 Å Co layers, and for a sample with 7.5 Å $Mn_3Ge$/1.5 Å Co/7.5 Å $Mn_3Ge$ layers, where all samples are annealed ex situ at 350° C., according to embodiments.

In particular, FIG. 6A shows the dependence of $H_c$ of 15 Å $Mn_3Ge$ layer as a function of thickness of the Co insertion layer placed underneath the Heusler layer. The $H_c$ of 15 Å $Mn_3Ge$ layer decreases with increasing thickness of the Co insertion layer. Such dependence is also observed independent of the thickness of the Heusler layer. FIG. 6B compares P-MOKE hysteresis loops for samples having 15 Å $Mn_3Ge$ layer along with and without 1.5 Å Co layer incorporated at 3 different positions (i.e., as described with respect to the embodiments of FIG. 1, FIG. 2 and FIG. 3). The inclusion of insertion layer lowers the $H_c$ of the $Mn_3Ge$ layer.

Figure 7A:
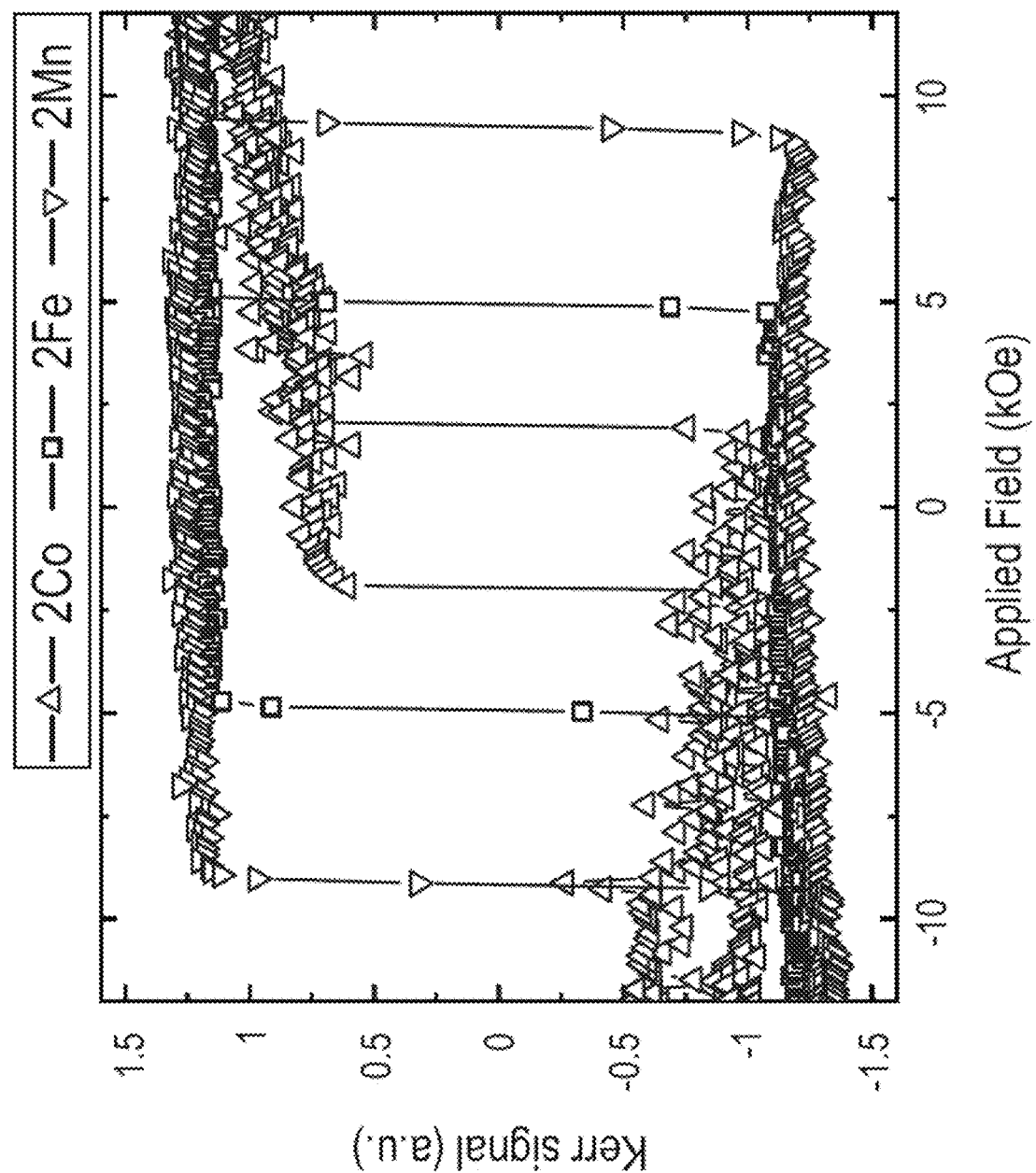
FIG. 7A is a graph that shows the perpendicular magneto-optical Kerr effect (P-MOKE) hysteresis loops for a sample with 2 Å Co/40 Å $Mn_3Ge$ layers, for a sample with 2 Å Fe/40 Å $Mn_3Ge$ layers, and for a sample with 2 Å Mn/40 Å $Mn_3Ge$ layers, where all samples are annealed in situ at 341° C., according to embodiments.
Figure 7B:
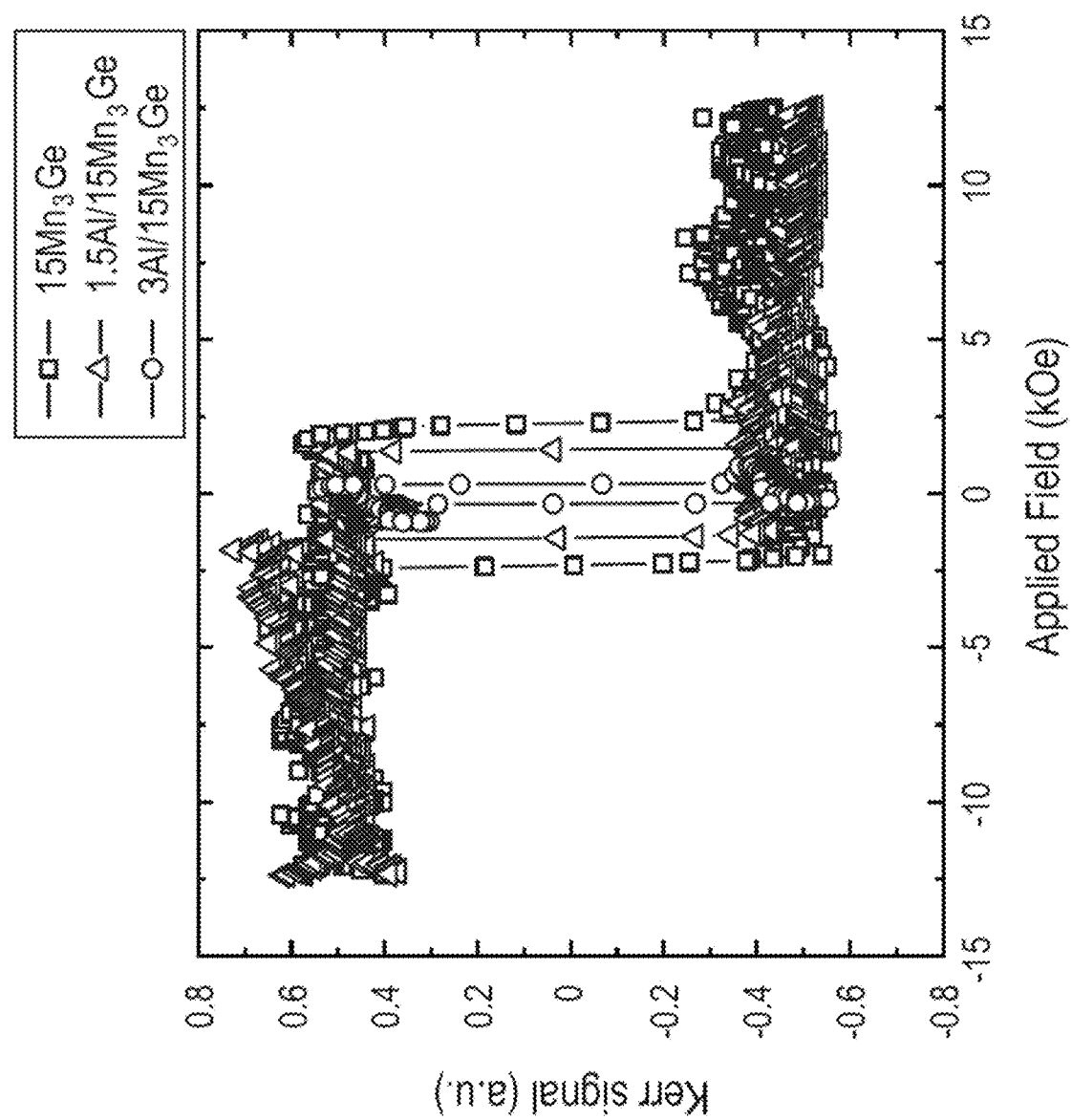
FIG. 7B is a graph that shows the perpendicular magneto-optical Kerr effect (P-MOKE) hysteresis loops for a sample with 15 Å $Mn_3Ge$, a sample with 1.5 Å Al/15 Å $Mn_3Ge$ layers, and for a sample with 3 Å Al/15 Å $Mn_3Ge$ layers, where the samples are not annealed, according to embodiments.

Referring now to FIGS. 7A and 7B, FIG. 7A is a graph that shows the perpendicular magneto-optical Kerr effect (P-MOKE) hysteresis loops for a sample with 2 Å Co/40 Å $Mn_3Ge$ layers, for a sample with 2 Å Fe/40 Å $Mn_3Ge$ layers, and for a sample with 2 Å Mn/40 Å $Mn_3Ge$ layers, where all samples annealed in situ at 341° C., and FIG. 7B is a graph that shows the perpendicular magneto-optical Kerr effect (P-MOKE) hysteresis loops for a sample with 15 Å $Mn_3Ge$, a sample with 1.5 Å Al/15 Å $Mn_3Ge$ layers, and for a sample with 3 Å Al/15 Å $Mn_3Ge$ layers, where the samples not annealed, according to embodiments.

In particular, FIG. 7A compares the perpendicular magneto-optical Kerr effect loops for sample with 40 Å $Mn_3Ge$ layer with various insertion layers, 2 Å Co, 2 Å Fe and 2 Å Mn. The $H_c$ of the sample with 40 Å $Mn_3Ge$ without any insertion layer is larger than ~12 kOe which is the high field limit of the magnet used on the P-MOKE measurement tool. Thus, even the Fe and the Mn insertion layers reduce the $H_c$ of $Mn_3Ge$ layer. These results suggest that with appropriate choice of the insertion layer and its thickness, it may be possible to achieve the desired $H_c$ for the $Mn_3Ge$ layer. FIG. 7B shows that Al insertion layer can also lower the $H_c$ for the $Mn_3Ge$ layer. The sample stack in the example of FIG. 7B includes MgO(001)/20 Å MgO/100 Å CoAl/0, 1.5 & 3 Å Al/15 Å $Mn_3Ge$/20 Å MgO/20 Å Ta.

The perpendicular magnetic anisotropy field ($H_k$) was determined by use of extrapolation of dependence of MTJ device switching voltage for 50% probability of switching the device state on applied perpendicular magnetic field during these switching measurements. The MTJ material stack in these measurements consisted of MgO(001)/20 Å MgO/400 Å Cr/300 Å CoAl/2 Å Co/x Å $Mn_3Ge$/MgO/CoFeB/Ta/Synthetic Anti-Ferromagnet/Ru. The MTJ device size after patterning was nominally 50 nm in diameter.

Figure 8:
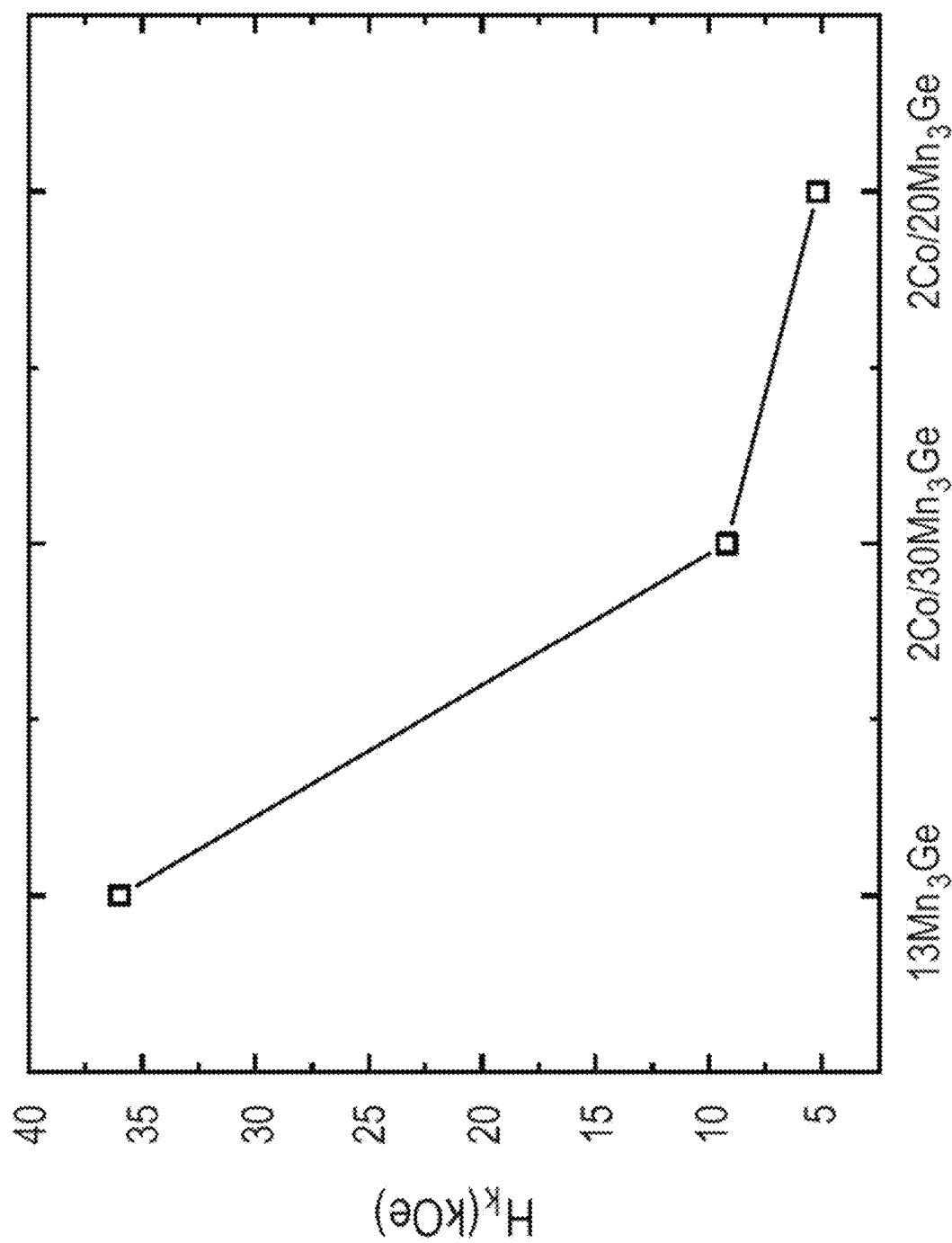
FIG. 8 is a graph that shows the perpendicular magnetic anisotropy field ($H_k$) determined from STT switching experiments from MTJ devices with free layers of 13 Å $Mn_3Ge$, 2 Å Co/30 Å $Mn_3Ge$, and 2 Å Co/20 Å $Mn_3Ge$, according to embodiments.

Referring now to FIG. 8, this figure is a graph that shows the perpendicular magnetic anisotropy field ($H_k$) determined from STT switching experiments from MTJ devices with free layers of 13 Å $Mn_3Ge$, 2 Å Co/30 Å $Mn_3Ge$, and 2 Å Co/20 Å $Mn_3Ge$, according to embodiments. In particular, FIG. 8 shows that without the Co insertion layer even thin 13 Å $Mn_3Ge$ layer has an $H_k$ of 36 kOe while with 2 Å Co insertion layer the $H_k$ is significantly reduced to 5.2 kOe and 9.2 kOe for $Mn_3Ge$ layer thicknesses of 20 Å and 30 Å, respectively.

Figure 9:
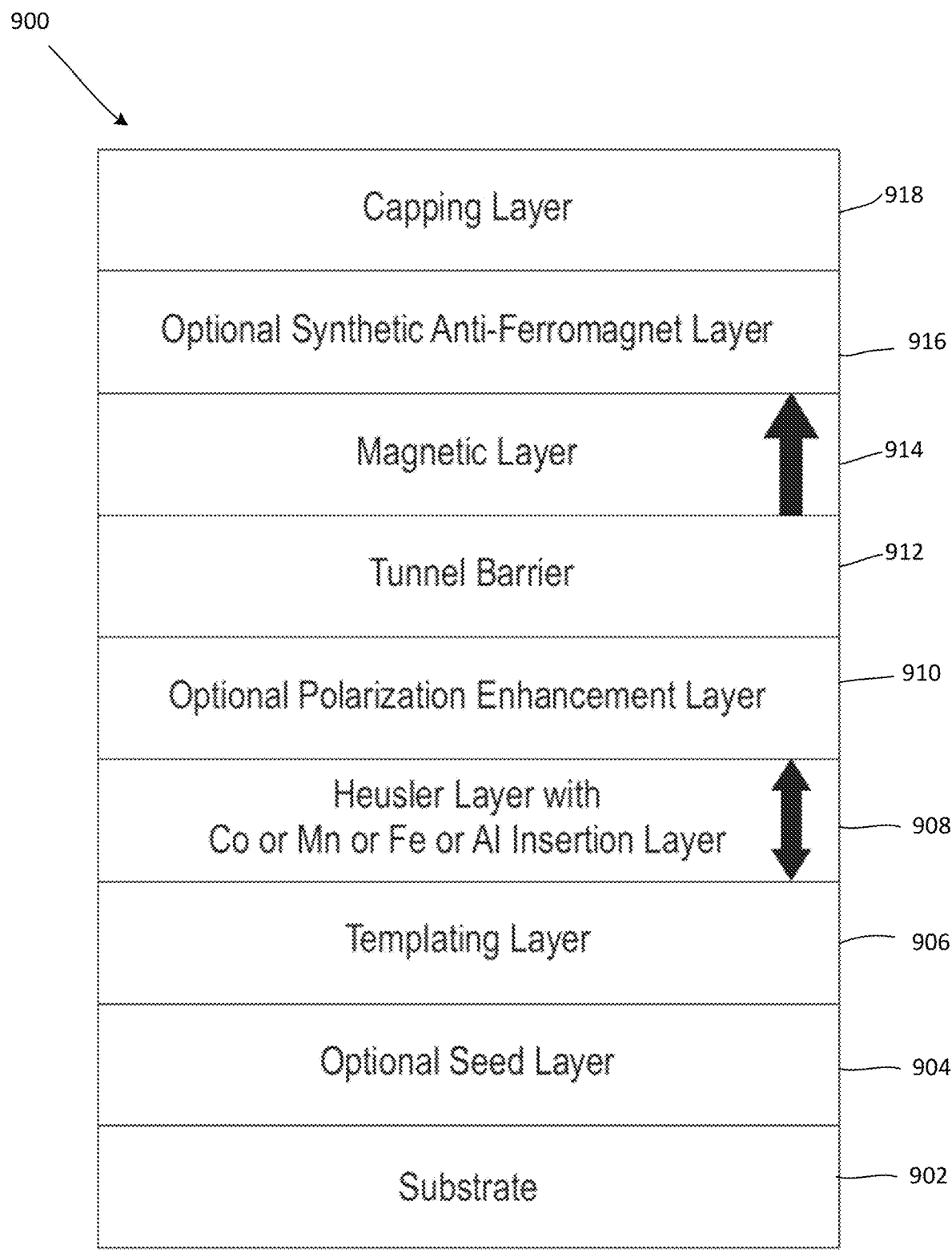
FIG. 9 is a cross-sectional side view of a magnetic tunnel junction device that incorporates a Heusler layer having a magnetic moment that is switchable, according to embodiments.

Referring now to FIG. 9, this figure is a cross-sectional side view of a magnetic tunnel junction device that incorporates a Heusler layer having magnetic moment that is switchable, according to embodiments. As shown in FIG. 9, the MTJ device 900 includes a substrate 902, an optional seed layer 904 provided on the substrate 902, a templating layer 906 provided on the optional seed layer 904, a combination layer 908 including a Heusler layer and an insertion layer provided on the templating layer 906, an optional polarization enhancement layer 910 provided on the combination layer 908, a tunnel barrier layer 912 provided on the optional polarization enhancement layer 910, a magnetic layer 914 provided on the tunnel barrier layer 912, an optional synthetic anti-ferromagnet layer 916 provided on the magnetic layer 914, and a capping layer 918 provided on the optional synthetic anti-ferromagnet layer 916. As shown in FIG. 9, the combination layer 908 (i.e., including the Heusler layer and insertion layer) has a magnetic moment that is switchable, indicated by the double ended arrow. Moreover, the magnetic layer 914 has a fixed magnetic moment, indicated by the single ended arrow. FIG. 9 further illustrates that when the magnetic layer 914 on top of the tunnel barrier layer 912 has a fixed magnetic moment, then its moment can be stabilized by placing a synthetic antiferromagnet (SAF) layer 916 adjacent to it. In certain embodiments, additional layers may be interposed between the CoFeB (i.e., the magnetic layer 914) and the SAF layer 916. The capping layer 918 may comprise Mo, W, Ta, Pt, Ru, or a combination thereof. Current may be induced by applying a voltage between the two magnetic electrodes (i.e., the magnetic layer 914 and the combination layer 908), which are separated by the tunnel barrier layer 912.

Figure 10:
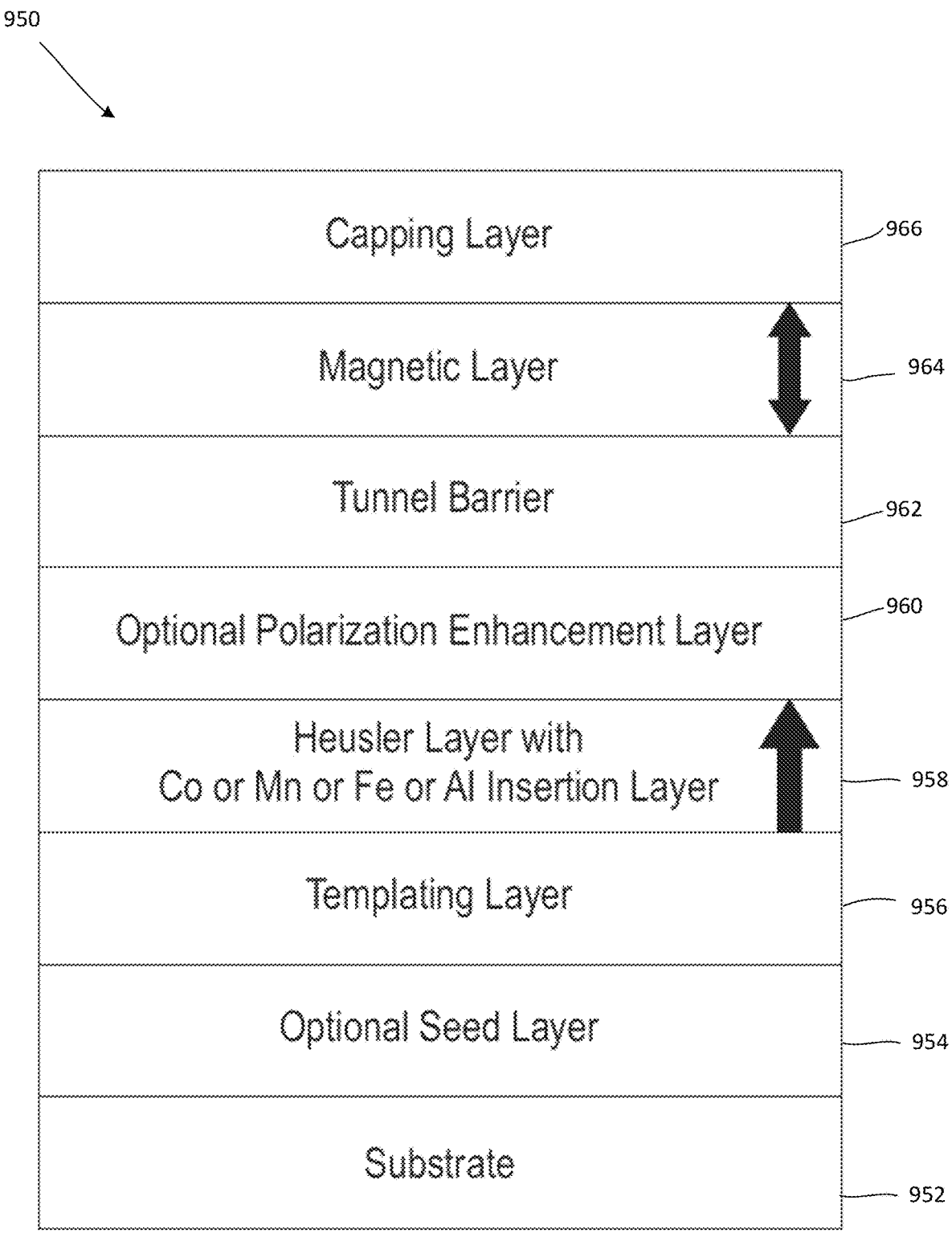
FIG. 10 is a cross-sectional side view of a magnetic tunnel junction device that incorporates a Heusler layer having a magnetic moment that is fixed, according to embodiments.

Referring now to FIG. 10, this figure is a cross-sectional side view of a magnetic tunnel junction device that incorporates a Heusler layer having a magnetic moment that is fixed, according to embodiments. As shown in FIG. 10, the MTJ device 950 includes a substrate 952, an optional seed layer 954 provided on the substrate 952, a templating layer 956 provided on the optional seed layer 954, a combination layer 958 including a Heusler layer and an insertion layer provided on the templating layer 956, an optional polarization enhancement layer 960 provided on the combination layer 958, a tunnel barrier layer 962 provided on the optional polarization enhancement layer 960, a magnetic layer 964 provided on the tunnel barrier layer 962, and a capping layer 966 provided on the magnetic layer 964. As shown in FIG. 10, the combination layer 958 (i.e., including the Heusler layer and insertion layer) has a magnetic moment that is fixed, indicated by the single ended arrow. Moreover, the magnetic layer 964 has a magnetic moment that is switchable, indicated by the double ended arrow. Current may be induced by applying a voltage between the two magnetic electrodes (i.e., the magnetic layer 964 and the combination layer 958), which are separated by the tunnel barrier layer 962.

It should be appreciated that the stack structures described herein may lend themselves to a variety of applications, including MRAM elements and a racetrack memory device. As with MRAM elements generally, a tunnel barrier (e.g., the tunnel barrier layer 912 of FIG. 9 or the tunnel barrier layer 962 of FIG. 10) is situated between two magnetic electrodes, one of which has a fixed magnetic moment and the other of which has a magnetic moment that is switchable, thereby permitting the recording and erasing of data. Unlike MRAM elements of certain related devices, however, the magnetic layer (i.e., the combination layer 908 of FIG. 9 or the combination layer 958 of FIG. 10) underneath the tunnel barrier layer 912 of FIG. 9 (i.e., the combination layer 908 having the switchable magnetic moment (storage layer)) or underneath the tunnel barrier layer 962 of FIG. 10 (i.e., the combination layer 958 having the fixed magnetic moment (pinned layer)) comprises Heusler compounds which includes ultrathin Co or Mn or Fe or Al insertion layers such as those described herein. An optional (second) polarization enhancing layer may be advantageously employed for even better performance, as described herein. This optional polarization enhancement layer may include Fe, a CoFe alloy, and/or $Co_2MnSi$.

Note that in FIGS. 9 and 10, the Heusler layer along with an insertion layer of Co or Fe or Mn or Al (i.e., the combination layer 908 in FIG. 9 or the combination layer 958 in FIG. 10) and the CoAl templating layer overlies an optional seed layer (i.e., the seed layer 904 in FIG. 9 or the seed layer 954 in FIG. 10) which in turn overlies a substrate.

The CoAl templating layer of FIGS. 9 and 10 (i.e., templating layer 906 of FIG. 9 or templating layer 956 of FIG. 10) may be a multi-layered structure that is non-magnetic at room temperature, and which comprises alternating layers of Co or CoIr alloy and at least one other element E (preferably Al or Ga; or Al alloyed with Ga, Ge, Sn or any combination thereof, such as AlSn, AlGe, AlGaGe, AlGaSn, AlGeSn, and AlGaGeSn). Note that CoIr may refer to an alloy of Co and Ir without referring to specific stoichiometry. The composition of this structure is represented by $Co_{1-x}E_x$ or $(CoIr)_{1-x}E_x$ with x being in the range from 0.45 to 0.55. Alternately, the templating layer is IrAl or RuAl or bilayer of CoAl/IrAl or CoAl/RuAl. The composition of these alternate templating layers can also be represented as indicated above for the CoAl layer. Overlying the respective templating layer is a magnetic layer that includes an Heusler compound, e.g., $Mn_3Ge$, $Mn_3Ga$, $Mn_3Sn$, or $Mn_3Sb$.

The composition of these binary Heusler compound can be $Mn_{3.3-x}Ge$, $Mn_{3.3-x}Sn$, and $Mn_{3.3-y}Sb$ (with y being in the range from 0 to 1.3 in the case of $Mn_{3.3-y}Sb$, and with x being in the range from 0 to 0.8 for $Mn_{3.3-x}Ge$ and $Mn_{3.3-x}Sn$). Alternatively, the Heusler compound may be a ternary compound, such as $Mn_{3.1-x}Co_{1.1-y}Sn$, in which x≤1.2 and y≤1.0. Alternately, the Heusler compound is replaced by an $L1_0$ compound, it may be selected from the group consisting of MnGa, MnAl, FeAl, MnGe, MnSb, and MnSn alloys. As described herein, the respective compositions of the seed layer and the substrate may be advantageously chosen to promote growth of the Heusler compound, whose magnetic moment is aligned perpendicular to the layer plane. An optional, polarization enhancement layer in contact with the tunnel barrier may be used to increase device performance, and may include Fe, a CoFe alloy, or $Co_2MnSi$.

In certain embodiments, the tunnel barrier may be MgO (001), although other (001)-oriented tunnel barriers may be used, such as CaO and LiF. Alternatively, $MgAl_2O_4$ can be used as a tunnel barrier whose lattice spacing can be tuned by controlling Mg—Al composition which could result in better lattice matching with the Heusler compounds (e.g., the composition of this tunnel barrier can be represented as $Mg_{1-z}Al_{2+(2/3)z}O_4$, wherein $-0.5<z<0.5$).

The magnetic electrode (i.e., the magnetic layer 914 of FIG. 9 or the magnetic layer 964 of FIG. 10) overlying the tunnel barrier layer may comprise Fe, a CoFe alloy, or a CoFeB alloy, for example. Note that CoFeB refers to an alloy of Co, Fe, and B without referring to specific stoichiometry.

Certain structures described herein may also be used in racetrack memory devices. In this case, the racetrack is a nanowire that may include a substrate, an optional seed layer, a templating layer, ultra-thin Co or Fe or Mn or Al insertion layer, and a magnetic layer of a Heusler compound. Note that in a racetrack memory device, the tunnel barrier and the switchable magnetic layer would not normally be present. Magnetic domain walls may be moved along this racetrack. Data may be read out of (and stored in) the racetrack by interrogating (or changing) the orientation of the magnetic moment of the magnetic material between adjacent domain walls within the racetrack.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device, comprising:
a multi-layered structure that is non-magnetic at room temperature, the multi-layered structure comprising alternating layers of Co and E, wherein E comprises at least one other element selected from the group consisting of Ge, Ga, Sn and Al, wherein a composition of the multi-layered structure is represented by $Co_{1-x}E_x$, with x being in a range from 0.42 to 0.55; and
a combined layer in contact with the multi-layered structure, the combined layer including an insertion layer in contact with a Heusler compound, the insertion layer consisting of an element selected from the group consisting of Co, Fe, Mn and Al.

2. The device of claim 1, wherein the combined layer is a first magnetic layer that forms part of a magnetic tunnel junction.

3. The device of claim 2, wherein a magnetic moment of the first magnetic layer is substantially perpendicular to an interface between the multi-layered structure and the first magnetic layer.

4. The device of claim 2, wherein the first magnetic layer has a thickness of less than 5 nm.

5. The device of claim 1, wherein the insertion layer has a thickness of less than or equal to 3 Å.

6. The device of claim 1, wherein the Heusler compound is a binary Heusler.

7. The device of claim 6, wherein the Heusler compound includes one or more of $Mn_{3.3-x}Ge$, $Mn_{3.3-x}Sn$, and $Mn_{3.3-y}Sb$, with x being in a range from 0 to 0.8 for $Mn_{3.3-x}Ge$ and $Mn_{3.3-x}Sn$ and with y being in a range from 0 to 1.3 for $Mn_{3.3-y}Sb$.

8. The device of claim 1, wherein Co within the multi-layered structure is replaced by a CoIr alloy and/or E includes an alloy selected from the group consisting of AlSn, AlGa, AlGe, AlGaGe, AlGaSn, AlGeSn, and AlGaGeSn.

9. The device of claim 1, further comprising a substrate underlying the multi-layered structure.

10. The device of claim 9, wherein a $Mn_xN$ or VN layer is interposed between the substrate and the multi-layered structure.

11. The device of claim 2, further comprising a tunnel barrier layer overlying the first magnetic layer, thereby permitting current to pass through both the tunnel barrier layer and the first magnetic layer.

12. The device of claim 11, comprising a second magnetic layer provided in contact with the tunnel barrier layer.

13. The device of claim 11, wherein the tunnel barrier layer comprises MgO.

14. The device of claim 11, wherein the tunnel barrier layer comprises $Mg_{1-z}Al_{2+(2/3)z}O_4$, wherein $-0.5<z<0.5$.

15. A method, comprising:
using a device as a memory element, the device including:
a multi-layered structure that is non-magnetic at room temperature, the multi-layered structure comprising alternating layers of Co and E, wherein E comprises at least one other element selected from the group consisting of Ge, Ga, Sn and Al, wherein a composition of the multi-layered structure is represented by $Co_{1-x}E_x$, with x being in a range from 0.45 to 0.55; and a combined layer in contact with the multi-layered structure, the combined layer including an insertion layer in contact with a Heusler compound, the insertion layer consisting of an element selected from the group consisting of Co, Fe, Mn and Al.

16. The method of claim 15, wherein the memory element is a racetrack memory device.

17. A magnetic tunnel junction device, comprising:

a substrate;

a multi-layered structure that is non-magnetic at room temperature, the multi-layered structure comprising alternating layers of Co and E, wherein E comprises at least one other element selected from the group consisting of Ge, Ga, Sn and Al, wherein a composition of the multi-layered structure is represented by $Co_{1-x}E_x$, with x being in a range from 0.42 to 0.55; and a first magnetic layer in contact with the multi-layered structure, the first magnetic layer including an insertion layer in contact with a Heusler compound, consisting of an element selected from the group consisting of Co, Fe, Mn and Al;

a tunnel barrier layer on the first magnetic layer; and a second magnetic layer on the tunnel barrier layer.

18. The magnetic tunnel junction device of claim 17, further comprising a synthetic anti-ferromagnetic layer on the second magnetic layer.

19. The magnetic tunnel junction device of claim 18, wherein the first magnetic layer has a magnetic moment that is switchable, and the second magnetic layer has a magnetic moment that is fixed.

20. The magnetic tunnel junction device of claim 18, wherein the first magnetic layer has a magnetic moment that is fixed, and the second magnetic layer has a magnetic moment that is switchable.

21. The magnetic tunnel junction device of claim 17, wherein the Heusler compound includes one or more of $Mn_{3.3-x}Ge$, $Mn_{3.3-x}Sn$, and $Mn_{3.3-y}Sb$, with x being in a range from 0 to 0.8 for $Mn_{3.3-x}Ge$ and $Mn_{3.3-x}Sn$ and with y being in a range from 0 to 1.3 for $Mn_{3.3-y}Sb$.

* * * * *